(12) United States Patent
Lin et al.

(10) Patent No.: US 8,138,787 B2
(45) Date of Patent: Mar. 20, 2012

(54) APPARATUS AND METHOD FOR INPUT/OUTPUT MODULE THAT OPTIMIZES FREQUENCY PERFORMANCE IN A CIRCUIT

(75) Inventors: Guu Lin, San Jose, CA (US); Yen-Fu Lin, San Jose, CA (US); Stephanie T. Tran, San Jose, CA (US); Pooyan Khoshkhoo, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 241 days.

(21) Appl. No.: 12/172,247

(22) Filed: Jul. 13, 2008

(65) Prior Publication Data

US 2010/0006904 A1 Jan. 14, 2010

(51) Int. Cl.
*G06F 7/38* (2006.01)
*H03K 19/173* (2006.01)

(52) U.S. Cl. ............... 326/37; 326/38; 326/47
(58) Field of Classification Search .......... 326/47, 326/101, 21–25, 37–41
See application file for complete search history.

(56) References Cited

U.S. PATENT DOCUMENTS

| 5,406,607 | A | * | 4/1995 | Marietta ............... 377/64 |
| 5,838,627 | A | | 11/1998 | Tomishima et al. |
| 5,847,936 | A | | 12/1998 | Forehand et al. |
| 6,591,410 | B1 | | 7/2003 | Ali et al. |
| 6,603,199 | B1 | | 8/2003 | Poddar |
| 6,873,563 | B2 | | 3/2005 | Suwa et al. |
| 6,972,464 | B2 | | 12/2005 | Shen |
| 6,998,719 | B2 | | 2/2006 | Campbell et al. |
| 7,091,614 | B2 | | 8/2006 | Cheng et al. |
| 7,339,211 | B2 | | 3/2008 | Kim et al. |
| 7,405,473 | B1 | | 7/2008 | Shi et al. |
| 7,800,915 | B2 | * | 9/2010 | Engblom et al. ............. 361/788 |
| 2003/0214344 | A1 | | 11/2003 | Suwa et al. |

FOREIGN PATENT DOCUMENTS

WO  WO 9211701 A2 * 7/1992

OTHER PUBLICATIONS

"Stratix III Device I/O Features," Altera Corporation, May 2008, pp. 7-1 through 7-52.
"International Search Report," and "Written Opinion of the International Search Report," Korean Intellectual Property Office, PCT/US2009/049822, Mar. 2, 2010, pp. 1-12.
European Patent Office, the Extended European Search Report including the Supplementary European Search Report and the European Search Opinion for European patent application 09798573.3, counterpart to U.S. Appl. No. 12/172,247, pp. 1-6.

* cited by examiner

*Primary Examiner* — Jason M Crawford
(74) *Attorney, Agent, or Firm* — Steven J. Cahill

(57) ABSTRACT

A circuit can include a module having signal pads that are configurable to route signals between the circuit and at least one external device. The module can also have unused pads that are interleaved between the signal pads. A circuit can include a module having signal pads that are configurable to route varying signals between the circuit and at least one external device. The module can also have voltage pads that are configurable to route substantially constant voltages between at least one external device and the circuit. The signal pads can be interleaved between the voltage pads. A module with one or more of these features can achieve ideal performance in both wire bond and flip chip packages with the flexibility of setting a different input/output utilization percentage within the module.

22 Claims, 4 Drawing Sheets

US 8,138,787 B2

APPARATUS AND METHOD FOR INPUT/OUTPUT MODULE THAT OPTIMIZES FREQUENCY PERFORMANCE IN A CIRCUIT

BACKGROUND OF THE INVENTION

The present invention relates to electronic circuits, and more particularly, to input/output modules that optimize frequency performance in a circuit.

An integrated circuit typically includes pads for routing signals between the integrated circuit and an external device. An integrated circuit can be housed in a package.

BRIEF SUMMARY OF THE INVENTION

According to some embodiments of the present invention, a circuit includes a module having signal pads that are configurable to route signals between the circuit and at least one external device. The module also includes unused pads that are interleaved between the signal pads.

According to other embodiments of the present invention, a circuit includes a module having signal pads that are configurable to route varying signals between the circuit and at least one external device. The module includes voltage pads that are configurable to route substantially constant voltages between at least one external device and the circuit. The signal pads are interleaved between the voltage pads.

According to other embodiments of the present invention, a circuit includes a module having signal pads that are configurable to route signals between the circuit and at least one external device. The module also includes unused pads coupled to buffers that are not configured to drive signals between the circuit and at least one external device when the circuit is housed in a first package type. The buffers are configured to drive signals between the circuit and at least one external device when the circuit is housed in a second package type. The present invention includes circuits and methods for implementing the techniques described herein.

Various objects, features, and advantages of the present invention will become apparent upon consideration of the following detailed description and the accompanying drawings.

DETAILED DESCRIPTION OF THE INVENTION

An integrated circuit (IC) die can be placed inside a package and mounted on a circuit board. Signals are transmitted between the IC and the circuit board through pads of the IC and through conductive material in the package. The pads are formed of conductive material. Each pad forms a contact on a surface of the IC die that can be used to route electrical signals to or from the IC die. An IC typically has numerous pads. The pads may be grouped into one or more input/output (IO) modules.

Figure 1:
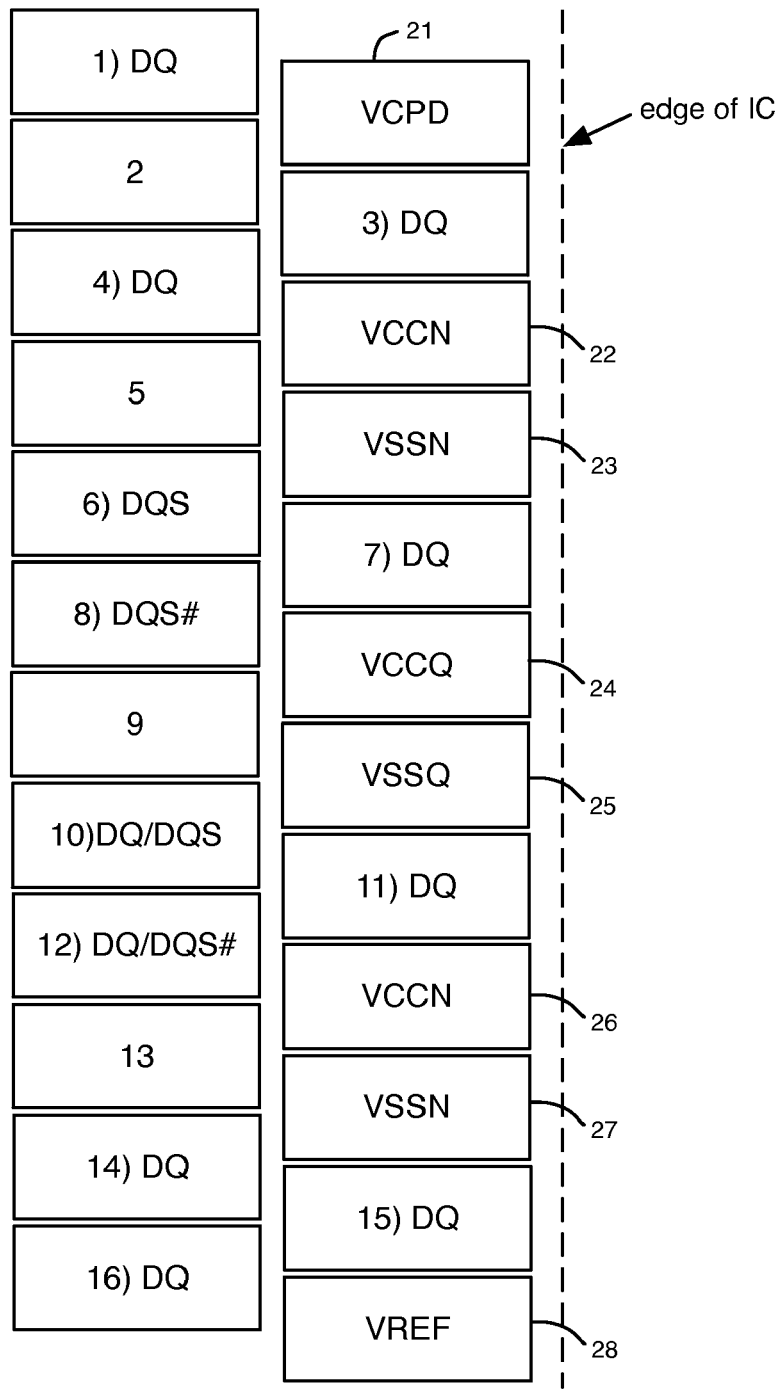
FIG. 1 illustrates an input/output (IO) module, according to an embodiment of the present invention.

FIG. 1 illustrates an input/output (IO) module, according to an embodiment of the present invention. IO module 100 of FIG. 1 includes 24 pads on an integrated circuit (IC) die. The 24 pads are external terminals of the IC that are used to route signals into the IC or out of the IC. The 24 pads shown in FIG. 1 are formed of conductive material on the IC. Although the pads are shown as rectangular in FIG. 1, the pads can be square shaped or any other desired shape. The dotted line on the right side of IO module 100 illustrates an example of where one edge of the IC can be located. IO module 100 includes 16 pads numbered 1-16 and pads VCPD 21, VCCN 22, VSSN 23, VCCQ 24, VSSQ 25, VCCN 26, VSSN 27, and VREF 28. The placements of the pads in IO module 100 are not limited to the placements shown in FIG. 1. IO modules of the present invention can include different placements and arrangements of the pads that fall within the scope and spirit of the present invention.

The pads in IO module 100 are arranged into two columns. The first column includes the pads numbered 1, 2, 4, 5, 6, 8, 9, 10, 12, 13, 14, and 16. The second column includes the pads numbered 21, 3, 22, 23, 7, 24, 25, 11, 26, 27, 15, and 28. Although only one IO module 100 is shown in FIG. 1, an integrated circuit (IC) can have several IO modules 100. For example, an IC can have one or more IO modules 100 next to each edge of the IC.

IO module 100 can be used in an integrated circuit (IC) die that is housed in a wire bond (WB) package, in a flip chip (FC) package, or in another type of package. When an IC is housed in a wire bond package, the pads of the IC are coupled to the package using wire bond connections. The pads are typically contacts on the top surface of the IC, and the wire bond connections couple the pads to conductive regions of the package below the IC. The package can couple the pads of the IC to a board or another wafer or chip.

When an IC is housed in a flip chip package, the pads of the IC are coupled to the package using solder bumps. The IC is mounted in a flip chip package with its pads facing down, and the solder bumps are mounted on the underside of the IC to connect the pads to conductive regions of the package under the IC.

When the IC containing module 100 is housed in a wire bond (WB) package, pads 1, 3, 4, 6, 7, 8, 10, 11, 12, 14, 15, and 16 are used to route signals between the IC and an external device. Pads 2, 5, 9, and 13 are not used to route signals between the IC and an external device. Because pads 2, 5, 9, and 13 are not used for routing signals, unused pads 2, 5, 9, and 13 provide shielding between signals that are routed through pads 1, 4, 6, 8, 10, 12, 14, and 16 in the left column of pads shown in FIG. 1. Unused pads 2, 5, 9, and 13 are interleaved between signal pads 1, 4, 6, 8, 10, 12, 14, and 16 to reduce cross talk between the signals transmitted through signal pads 1, 4, 6, 8, 10, 12, 14, and 16. As a result, unused pads 2, 5, 9, and 13 increase the signal-to-noise ratios of the signals transmitted through pads 1, 4, 6, 8, 10, 12, 14, and 16.

Figure 2A:
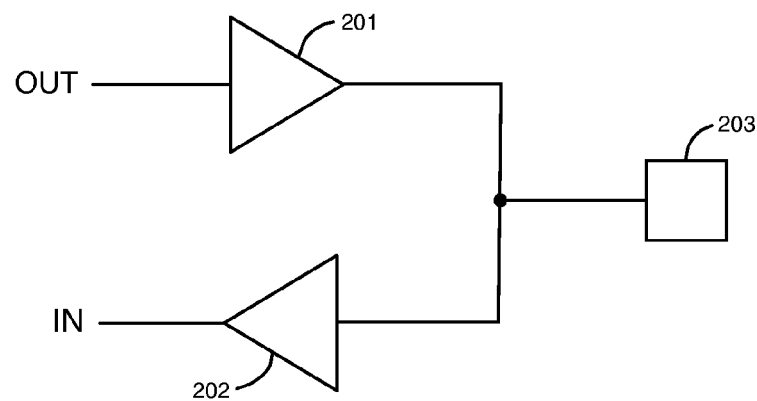
FIG. 2A illustrates an output buffer, an input buffer, and a pad on an integrated circuit, according to an embodiment of the present invention.
Figure 2B:
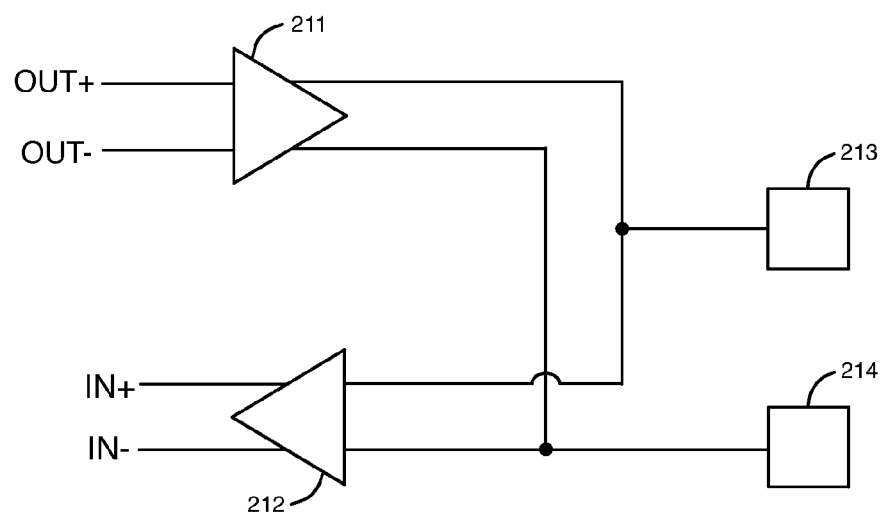
FIG. 2B illustrates a differential output buffer, a differential input buffer, and pads on an integrated circuit, according to an embodiment of the present invention.

Output signals are transmitted through pads in IO module 100 from output (transmitter) buffers, and input signals are transmitted through pads in IO module 100 to input (receiver) buffers, as shown, e.g., in FIGS. 2A-2B. FIG. 2A illustrates an output buffer 201, an input buffer 202, and a pad 203 on an integrated circuit, according to an embodiment of the present invention. Output buffer 201 can be enabled to drive a single-ended output signal OUT outside of the integrated circuit through pad 203. Input buffer 202 can be enabled to drive a single-ended input signal IN received at pad 203 from outside the integrated circuit. FIG. 2B illustrates a differential output buffer 211, a differential input buffer 212, and pads 213-214 on an integrated circuit, according to an embodiment of the present invention. Output buffer 211 can be enabled to drive a differential output signal OUT+/OUT− outside of the integrated circuit through pads 213 and 214. Input buffer 212 can be enabled to drive a differential input signal IN+/IN− received at pads 213 and 214 from outside the integrated circuit.

When the IC containing module 100 is housed in a flip chip (FC) package, input and output signals can be driven between the input and output buffers on the IC and external circuitry through solder bumps without routing the signals through any of the pads in IO module 100. Each of the pads numbered 1-16 in FIG. 1 is coupled to an output buffer and/or an input buffer. When the IC is housed in an FC package, buffers that are coupled to the pads numbered 1-16 can be enabled to transmit signals between the IC and external circuitry. 16 buffers coupled to pads 1-16 in IO module 100 can be enabled to drive 16 signals between the IC and at least one external device without routing the 16 signals through the pads in IO module 100 when the IC is housed in an FC package. One buffer per pad (at each pad 1-16) drives an input signal or an output signal without routing the input or output signal through the pad.

IO module 100 allows the IC that contains module 100 to be used in different types of packages. IO module 100 can accommodate a different input/output (IO) utilization percentage for different types of packages to achieve an optimal maximum frequency performance for signals in the integrated circuit. For example, when an IC containing IO module 100 is housed in a WB package, 12 pads out of the 16 pads numbered 1-16 in FIG. 1 are used to route 12 signals between the IC and external circuitry, and 4 of the 16 pads numbered 1-16 are unused, as described above. Thus, IO module 100 provides up to 75% IO utilization (12 pads out of 16 pads) when the IC containing module 100 is housed in a WB package.

As another example, when the IC containing IO module 100 is housed in a flip chip (FC) package, 16 IO buffers coupled to the 16 pads numbered 1-16 can be used to transmit 16 signals between the IC and external circuitry through solder bumps without routing the 16 signals through pads 1-16. One buffer per pad transmits one of the 16 signals. Thus, IO module 100 can be coupled to 16 IO buffers that provide up to 100% IO utilization (16 buffers per 16 pads) when the IC containing module 100 is housed in an FC package.

When the IC containing IO module 100 is housed in a wire bond (WB) package, 8 or 10 pads in IO module 100 can be used to route input and/or output data signals, 2 or 4 pads in IO module 100 can be used to route data strobe signals, and 4 pads in IO module 100 are unused pads. The pads used to route input and/or output data signals are referred to as DQ pads. The DQ data signal pads include the pads numbered 1, 3, 4, 7, 11, 14, 15, and 16 in IO module 100. The pads numbered 10 and 12 can also be used as DQ data signal pads. The data signals routed through the DQ data signal pads are typically digital signals that vary between logic high and logic low states.

Unused pad 2 shields signals that are routed through pads 1 and 4. Unused pad 5 shields signals that are routed through pads 4 and 6. Unused pad 9 shields signals that are routed through pads 8 and 10. Unused pad 13 shields signals that are routed through pads 12 and 14.

Data output signals can be transmitted from the IC containing module 100 to an external memory device (e.g., a memory chip) through one or more of the DQ pads in IO module 100. As another example, data input signals can be transmitted from an external memory device to the IC through one or more of the DQ pads in IO module 100. As yet another example, data input signals and data output signals can be transmitted bi-directionally between an external memory device and the IC through the DQ pads in IO module 100.

If pads 1, 3, 4, 7, 10, 11, 12, 14, 15, and 16 in IO module 100 are configured as DQ data signal pads when the IC is in a WB package, then IO module 100 can, for example, support an ×8 DQ grouping or a ×9 DQ grouping for an external memory device (e.g., an SDRAM device). In an ×8 DQ grouping, 8 data signals are transmitted in parallel through 8 DQ pads to form an 8-bit data byte. In a ×9 DQ grouping, 9 data signals are transmitted in parallel through 9 DQ pads to form a 9-bit data byte. If only pads 1, 3, 4, 7, 11, 14, 15, and 16 in IO module 100 are configured as DQ data signal pads in a WB package, then IO module 100 can support up to an ×8 grouping for the external memory device. Thus, if IO module 100 is configured to use pads 1, 3, 4, 7, 11, 14, 15, and 16 as DQ data signal pads, pad 10 as a DQS pad, and pad 12 as a DQS# pad, then IO module 100 can support up to an ×8 DQ grouping.

IO module 100 can also support two ×4 DQ groupings of pads 1, 3, 4, 7, 11, 14, 15, and 16. In this embodiment, pads 1, 3, 4, and 7 are used to route data signals forming a first 4-bit byte between the IC and an external memory device, and pads 11, 14, 15, and 16 are used to route data signals forming a second 4-byte between the IC and the external memory device. In a flip chip (FC) package, buffers coupled to pads 1, 3, 4, 7, 11, 14, 15, 16, and optionally pads 10 and 12, can drive DQ data signals to or from an external memory device without routing the DQ data signals through the pads in IO module 100.

In a ×4, ×8 or ×9 DQ grouping, the data signals can, for example, be routed through 8 or 9 DQ pads, respectively, in IO module 100 at a double data rate (e.g., DDR, DDR2, DDR3, etc.). A signal bus operating at a double data rate transfers data on both the rising and falling edges of the clock signal. Alternatively, the data signals can, for example, be routed through 8 or 9 DQ pads in IO module 100 at a quad data rate (e.g., QDR, QDRII, etc.). Quad data rate is a communication signaling technique that causes data to be transmitted on both the rising and falling edges of the clock signal, using independent Read and Write Data pins, i.e., 2 Writes and 2 Reads in one clock cycle using 2 pins, so that 4 bits of data are transmitted in each clock cycle.

The one or two extra DQ pads that are not used to route data signals in ×4, ×8 and ×9 groupings can be used, for example, to route a data mask signal and/or a byte write select signal. The data mask signal is an input mask signal for writing data to an external memory device. The byte write select signal is used to select which data byte is written to the external memory device during the current portion of the write operations.

When the IC containing IO module 100 is housed in a wire bond (WB) package, 1 or 2 DQS pads and 1 or 2 DQS# pads in IO module 100 can be used to route data strobe signals between the IC and an external memory device (e.g., an SDRAM chip). In a flip chip (FC) package, buffers coupled to the DQS and DQS# pads drive data strobe signals between the IC containing module 100 and an external memory device without routing the signals through the DQS or DQS# pads. The data strobe signals that are transmitted through the DQS and DQS# pads are used to sample the data that is transmitted through the DQ data pads.

The data strobe signals are typically digital signals that toggle between high and low logic states. If a differential data strobe signal is used, the differential data strobe signal is transmitted through data strobe pads DQS and DQS#. If a single-ended data strobe signal is used, the single-ended data strobe signal is typically transmitted through data strobe pad DQS.

One DQS pad is numbered as pad 6, and one DQS# pad is numbered as pad 8 in FIG. 1. Pad 10 can be used as a second DQS data strobe pad, and pad 12 can be used as a second DQS# data strobe pad. Thus, pad 10 can be used as a data DQ pad or data strobe DQS pad, and pad 12 can be used as a data DQ pad or data strobe DQS# pad. Each DQS pad is preferably located next to a DQS# pad that routes the complementary data strobe signal for that particular DQS pad. Thus, pads 6 and 8 can be used to route a first differential data strobe signal DQS and DQS#, and pads 10 and 12 can be used to route a second differential data strobe signal DQS and DQS#.

IO module 100 also includes voltage pads VCPD 21, VCCN 22, VSSN 23, VCCQ 24, VSSQ 25, VCCN 26, VSSN 27, and VREF 28. A first supply voltage is transmitted from an external source through supply voltage pad VCPD 21 to a pre-driver circuit on the IC. A second supply voltage is transmitted from an external source through two supply voltage pads VCCN 22 and 26 to circuit elements that are located in the periphery of the IC. A first ground voltage is provided from an external source through the two VSSN pads 23 and 27 to the circuit elements that are located in the periphery of the IC. The supply voltage received by the circuit elements located in the periphery of the IC equals the voltage at the VCCN pads minus the voltage at the VSSN pads.

A third supply voltage is transmitted from an external source through a supply voltage pad VCCQ 24 to circuit elements that are located in the core region of the IC. A second ground voltage is provided from an external source through the VSSQ 25 pad to the circuit elements that are located in the core region of the IC. The supply voltage received by the circuit elements located in the core region of the IC is a quiet supply voltage that equals the voltage at VCCQ pad 24 minus the voltage at VSSQ pad 25. A reference voltage is transmitted between an external device (e.g., an external memory device) and the IC through the VREF 28 pad.

All of the signals that are transmitted through pads VCPD 21, VCCN 22, VSSN 23, VCCQ 24, VSSQ 25, VCCN 26, VSSN 27, and VREF 28 have substantially constant voltages that do not toggle between logic high and logic low levels. As shown in FIG. 1, DQ signal pads 3,7,11, and 15 are interleaved between voltage pads VCPD 21, VCCN 22, VSSN 23, VCCQ 24, VSSQ 25, VCCN 26, VSSN 27, and VREF 28. Interleaving DQ pads 3, 7, 11, and 15 between pads VCPD 21, VCCN 22, VSSN 23, VCCQ 24, VSSQ 25, VCCN 26, VSSN 27, and VREF 28 reduces cross-talk and increases the signal-to-noise ratios of the data signals transmitted through DQ pads 3, 7, 11, and 15, because the voltages of the signals transmitted through voltage pads VCPD 21, VCCN 22, VSSN 23, VCCQ 24, VSSQ 25, VCCN 26, VSSN 27, and VREF 28 remain substantially constant during circuit operation.

Figure 3:
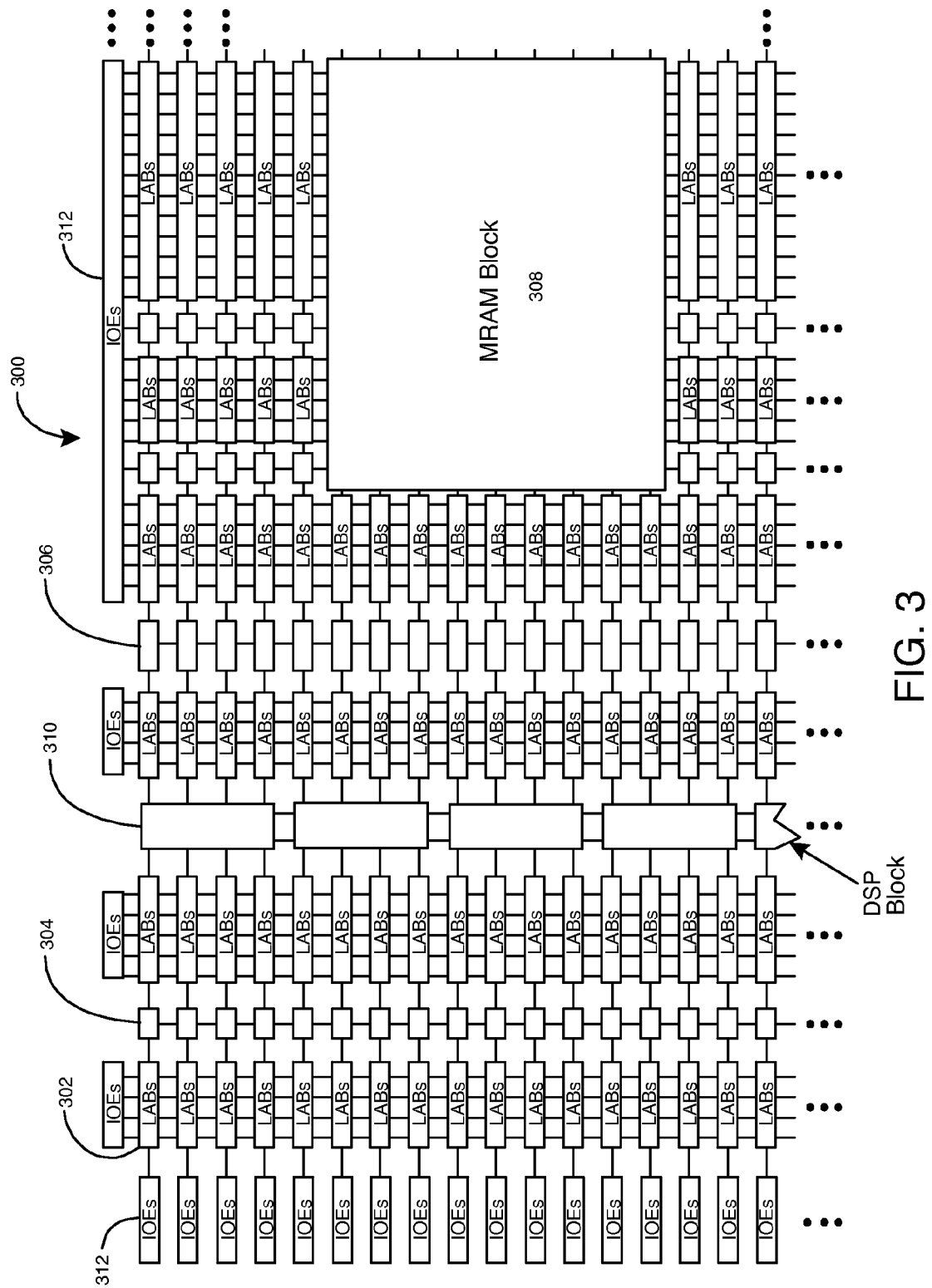
FIG. 3 is a simplified partial block diagram of a field programmable gate array (FPGA) that can include aspects of the present invention.

FIG. 3 is a simplified partial block diagram of a field programmable gate array (FPGA) 300 that can include aspects of the present invention. FPGA 300 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 300 includes a two-dimensional array of programmable logic array blocks (or LABs) 302 that are interconnected by a network of column and row interconnect conductors of varying length and speed. LABs 302 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including random access memory (RAM) blocks of varying sizes provided throughout the array. The RAM blocks include, for example, blocks 304, blocks 306, and block 308. These memory blocks can also include shift registers and first-in-first-out (FIFO) buffers.

FPGA 300 further includes digital signal processing (DSP) blocks 310 that can implement, for example, multipliers with add or subtract features. Input/output elements (IOEs) 312 located, in this example, around the periphery of the chip, support numerous single-ended and differential input/output standards. IOEs 312 include input and output buffers that are coupled to pads of the integrated circuit, as shown for example, in FIGS. 2A-2B. Each of the pads is an external terminal of the FPGA die that can be used to route, for example, input signals, output signals, or constant voltages between the FPGA and one or more external devices. The pads in IO module 100 can be coupled to one or more IOEs. It is to be understood that FPGA 300 is described herein for illustrative purposes only and that the present invention can be implemented in many different types of PLDs, FPGAs, and ASICs.

Figure 4:
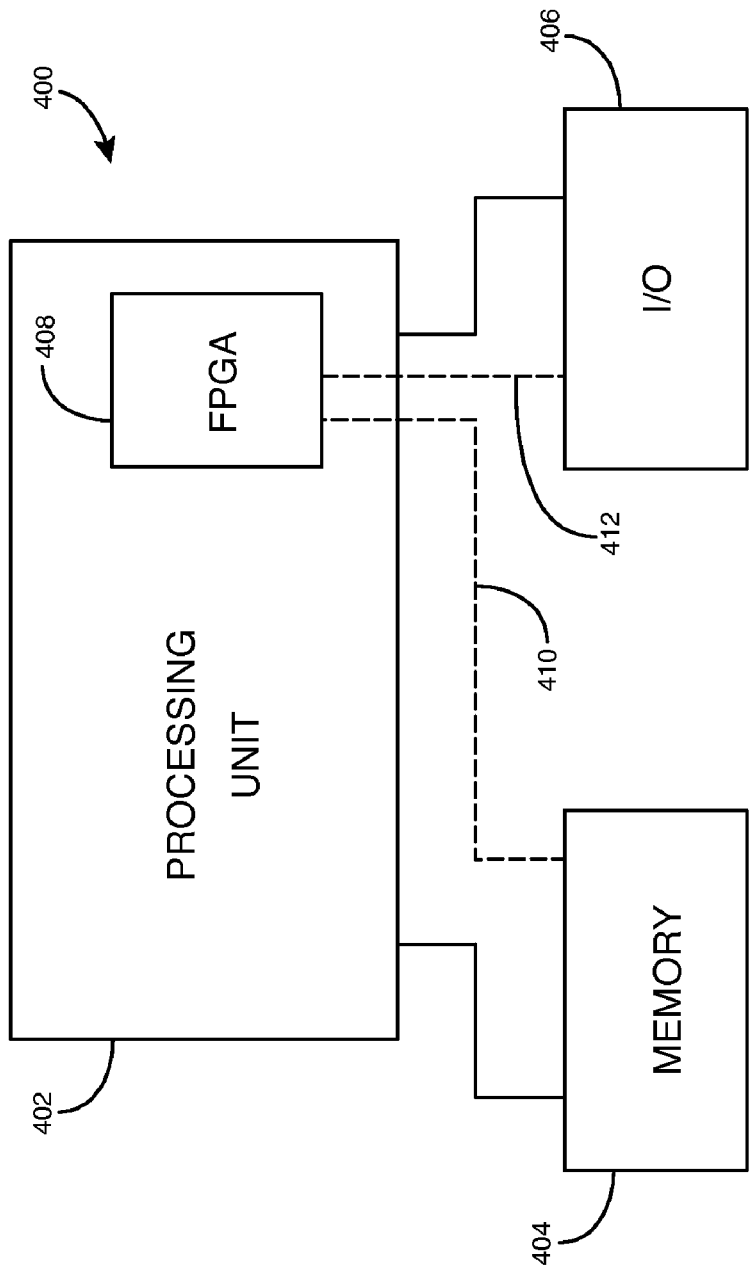
FIG. 4 shows a block diagram of an exemplary digital system that can embody techniques of the present invention.

The present invention can also be implemented in a system that has an FPGA as one of several components. FIG. 4 shows a block diagram of an exemplary digital system 400 that can embody techniques of the present invention. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404, and an input/output (I/O) unit 406 interconnected together by one or more buses. According to this exemplary embodiment, an FPGA 408 is embedded in processing unit 402. FPGA 408 can serve many different purposes within the system of FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404, receive and transmit data via I/O unit 406, or other similar functions. Processing unit 402 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 408 can control the logical operations of the system. As another example, FPGA 408 acts as a reconfigurable processor, which can be reprogrammed as needed to handle a particular computing task. Alternatively, FPGA 408 can itself include an embedded microprocessor. Memory unit 404 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit die comprising a module, the module comprising:
   a first plurality of signal pads;
   unused pads that are interleaved between the first plurality of signal pads; and
   a first plurality of buffers, wherein each of the unused pads is coupled to at least one of the first plurality of buffers, wherein the first plurality of signal pads and the unused pads comprise conductive material disposed on the integrated circuit die, wherein each of the unused pads and each of the first plurality of signal pads is a contact on a surface of the integrated circuit die, and wherein the first plurality of buffers is operable to drive signals between the integrated circuit die and at least one external device without routing the signals through any of the unused pads and without routing the signals through any of the first plurality of signal pads.

2. The integrated circuit die defined in claim 1 wherein the first plurality of signal pads is configurable to route digital signals that toggle between high and low logic states between the integrated circuit die and at least one external device.

3. The integrated circuit die defined in claim 1 wherein at least one of the first plurality of signal pads is adjacent to two of the unused pads.

4. The integrated circuit die defined in claim 1 wherein the first plurality of signal pads comprises two differential pads that are grouped together in the module, and the module comprises at least four signal pads of the first plurality of signal pads and at least three of the unused pads.

5. The integrated circuit die defined in claim 1 further comprising:
   a second plurality of buffers coupled to the first plurality of signal pads.

6. The integrated circuit die defined in claim 1 wherein at least two of the first plurality of signal pads are adjacent to each other.

7. The integrated circuit die defined in claim 1 wherein the module further comprises:
   a plurality of voltage pads that is configurable to route voltage signals between the integrated circuit die and at least one external device, wherein the voltage signals are maintained at substantially constant voltages; and
   a second plurality of signal pads that is configurable to route digital signals between the integrated circuit die and at least one external device, wherein the second plurality of signal pads is interleaved between the plurality of voltage pads, and wherein each of the plurality of voltage pads and each of the second plurality of signal pads is a contact on a surface of the integrated circuit die.

8. The integrated circuit die defined in claim 1 wherein the integrated circuit die is a programmable logic integrated circuit die.

9. The integrated circuit die defined in claim 1 wherein the first plurality of signal pads is configured to route data signals and at least one data strobe signal between the integrated circuit die and an external memory device.

10. An integrated circuit die comprising a module, the module comprising:
    a first plurality of signal pads;
    a plurality of buffers coupled to the first plurality of signal pads;
    a first voltage pad operable to provide only a first supply voltage to first circuit elements; and
    a second voltage pad operable to provide only a first ground voltage to the first circuit elements, wherein the first plurality of signal pads is interleaved between the first and the second voltage pads, wherein the first plurality of signal pads and the first and the second voltage pads comprise conductive material disposed on the integrated circuit die, wherein each of the first and the second voltage pads and each of the first plurality of signal pads is a contact on a surface of the integrated circuit die, and wherein the plurality of buffers is operable to drive signals between the integrated circuit die and at least one external device without routing the signals through any of the first plurality of signal pads.

11. The integrated circuit die defined in claim 10 wherein the module further comprises:
    a third voltage pad operable to provide only a second supply voltage to second circuit elements; and
    a fourth voltage pad operable to provide only a second ground voltage to the second circuit elements, wherein the first plurality of signal pads is interleaved between the first, the second, the third, and the fourth voltage pads, and wherein the third and the fourth voltage pads comprise conductive material disposed on the integrated circuit die, and wherein each of the third and the fourth voltage pads is a contact on a surface of the integrated circuit die.

12. The integrated circuit die defined in claim 11 wherein the module further comprises:
    a fifth voltage pad operable to provide only the first supply voltage to the first circuit elements; and
    a sixth voltage pad operable to provide only the first ground voltage to the first circuit elements, wherein the first plurality of signal pads is interleaved between the first, the second, the third, the fourth, the fifth, and the sixth voltage pads, wherein the fifth and the sixth voltage pads comprise conductive material disposed on the integrated circuit die, and wherein each of the fifth and the sixth voltage pads is a contact on a surface of the integrated circuit die.

13. The integrated circuit die defined in claim 10 wherein the first voltage pad is adjacent to the second voltage pad.

14. The integrated circuit die defined in claim 10 wherein the first plurality of signal pads is configurable to route digital signals that toggle between high and low logic states between the integrated circuit die and at least one external device.

15. The integrated circuit die defined in claim 10 wherein the module further comprises:

a second plurality of signal pads that is configurable to route digital signals between the integrated circuit die and at least one external device; and unused pads that are interleaved between the second plurality of signal pads, wherein the second plurality of signal pads and the unused pads comprise conductive material disposed on the integrated circuit die.

16. An integrated circuit die comprising a module, the module comprising:

a first plurality of signal pads;

unused pads operable to provide shielding between the first plurality of signal pads; and a plurality of buffers, wherein each of the first plurality of signal pads and each of the unused pads is coupled to at least one of the plurality of buffers, wherein the first plurality of signal pads and the unused pads comprise conductive material disposed on the integrated circuit die, wherein each of the unused pads and each of the first plurality of signal pads is a contact on a surface of the integrated circuit die, and wherein the plurality of buffers is operable to drive signals between the integrated circuit die and at least one external device in a flip-chip mode through solder bumps without routing the signals through any of the unused pads and without routing the signals through any of the first plurality of signal pads.

17. The integrated circuit die defined in claim 16 wherein the first plurality of signal pads comprises two differential pads that are grouped together in the module, and the module comprises at least four signal pads of the first plurality of signal pads and at least three of the unused pads.

18. The integrated circuit die defined in claim 16 wherein the unused pads are interleaved between the first plurality of signal pads.

19. The integrated circuit die defined in claim 16 wherein the first plurality of signal pads and the unused pads are in a first column of pads, and the module further comprises:

a second plurality of signal pads that is configurable to route digital signals between the integrated circuit die and at least one external device; and a plurality of voltage pads that is configurable to route substantially constant voltages between at least one external device and the integrated circuit die, wherein the second plurality of signal pads is interleaved between the plurality of voltage pads in a second column of pads, and wherein the second column of pads is adjacent to the first column of pads in the module.

20. A method for increasing signal-to-noise ratios of signals routed through pads on an integrated circuit die, the method comprising:

forming a plurality of signal pads on the integrated circuit die;

forming unused pads on the integrated circuit die, wherein the unused pads are interleaved between the plurality of signal pads such that each of the unused pads is adjacent to at least two of the plurality of signal pads, and wherein the plurality of signal pads and the unused pads comprise conductive material disposed on the integrated circuit die; and forming a plurality of buffers on the integrated circuit die, wherein each of the plurality of signal pads and each of the unused pads is coupled to at least one of the plurality of buffers, wherein each of the unused pads and each of the plurality of signal pads is a contact on a surface of the integrated circuit die, and wherein the plurality of buffers is operable to drive signals between the integrated circuit die and at least one external device without routing the signals through any of the unused pads and without routing the signals through any of the plurality of signal pads.

21. The method defined in claim 20 wherein the plurality of signal pads is configurable to route digital signals between the integrated circuit die and at least one external device.

22. The method defined in claim 20 wherein at least two of the plurality of signal pads are formed adjacent to each other.

* * * * *